United States Patent
Yonenaga et al.

(10) Patent No.: US 6,727,751 B2
(45) Date of Patent: Apr. 27, 2004

(54) DISTORTION COMPENSATION AMPLIFIER

(75) Inventors: Hiroichi Yonenaga, Tokyo (JP);
Kiyoshi Funada, Tokyo (JP); Kotaro Takenaga, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/246,524

(22) Filed: Sep. 19, 2002

(65) Prior Publication Data

US 2003/0058043 A1 Mar. 27, 2003

(30) Foreign Application Priority Data

Sep. 27, 2001 (JP) .................................. 2001-296870

(51) Int. Cl.[7] .............................................. H03F 1/00
(52) U.S. Cl. ...................................... 330/151; 330/149
(58) Field of Search ........................... 330/52, 149, 151

(56) References Cited

U.S. PATENT DOCUMENTS

| | | | |
|---|---|---|---|
| 4,346,349 A | | 8/1982 | Yokoyama |
| 5,235,289 A | | 8/1993 | Kunitomo |
| 5,528,196 A | | 6/1996 | Baskin et al. |
| 6,191,652 B1 | * | 2/2001 | Gentzler ...................... 330/52 |
| 6,271,722 B1 | * | 8/2001 | Ballantyne .................... 330/51 |
| 6,326,845 B1 | * | 12/2001 | Miyaji et al. ................ 330/151 |

FOREIGN PATENT DOCUMENTS

| | | |
|---|---|---|
| EP | 0485183 A3 | 5/1992 |
| EP | 0485183 A2 | 5/1992 |
| EP | 0996225 A1 | 4/2000 |
| EP | 1098434 A2 | 5/2001 |

OTHER PUBLICATIONS

Sokal, N.: "RF Power Amplifiers, Classes A Through S How They Operate, and When to Use Each", Electronic Industries Forum of New England. 1997. Professional Program Proceedings Boston, MA, USA May 6–9, 1997. pp. 179 252.
Muhonen, K. et al.: "Amplifier Linearization for the Local Multipoint Distribution System Application", Personal, Indoor and Mobile Radio Communications, 1998. The Ninth IEEE International Symposium on Boston, MA. Sep. 8–11, 1998 pp. 687 692.

* cited by examiner

Primary Examiner—Henry Choe
(74) Attorney, Agent, or Firm—Wenderoth, Lind & Ponack, L.L.P.

(57) ABSTRACT

A distortion compensation amplifier has a distortion detection loop that divides an input signal, amplifies one divided signal with an amplifier and uses the amplified signal and another divided signal to detect a distortion component generated and introduced into the amplified signal in the amplifier. The amplifier additionally has a distortion removal loop that removes the detected distortion component from the amplified signal produced by the amplifier. The distortion detection loop comprises a filter for reducing the distortion component of the amplified signal output by the amplifier that was generated and introduced into the amplified signal in the amplifier and detects the distortion component reduced by the filter. The distortion removal loop removes from the amplified signal the detected distortion component that was produced by the amplifier and reduced by the filter.

20 Claims, 9 Drawing Sheets

DISTORTION COMPENSATION AMPLIFIER

FIELD OF THE INVENTION

This invention relates to a distortion compensation amplifier that compensates for distortion arising in an amplifier when the amplifier amplifies a signal. This invention particularly relates to a distortion compensation amplifier that, by reducing the distortion suppression required in a distortion removal loop, enables amplification with distortion compensation of signals over a broader band of frequencies than heretofore.

DESCRIPTION OF THE PRIOR ART

The transmitter unit of a base station used in a mobile phone system, Personal Handy phone System (PHS) or other such mobile telecommunications system uses an amplifier to amplify signals to be wirelessly transmitted. Since distortion occurs during the amplification of the signals by the amplifier, the transmitter unit is equipped with a circuit for compensating for the distortion.

FIG. 5 shows an example of a conventional distortion compensation amplifier unit. Specifically, it shows the configuration of a common amplifier capable of performing distortion compensation by the feedforward method. (A common amplifier uses an amplifier to amplify signals that include multiple frequency components.)

The illustrated common amplifier unit is equipped with three directional combiners 1, 5 and 9, two vector adjusters 2 and 7, a main amplifier 3, two delay lines 4 and 6, an auxiliary amplifier 8, a pilot signal generator 10, a receiver 11 and a control circuit 12. Also shown are an input terminal C and an output terminal D of the common amplifier unit.

The directional combiner 1, directional combiner 5 and the group of components between them (the vector adjuster 2, main amplifier 3 and delay line 4) constitute a circuit that functions as a distortion detection loop.

A multifrequency signal input to the distortion detection loop through the input terminal C is divided by the directional combiner 1. One divided signal is adjusted in amplitude and phase by the vector adjuster 2, amplified to a desired power by the main amplifier 3, and input to the directional combiner 5. Another divided signal is delayed by the delay line 4 and input to the directional combiner 5. The directional combiner 5 outputs (part of) the amplified signal received from the main amplifier 3 to the delay line 6, adds the (remaining part of) the amplified signal and the delayed input multifrequency signal received from the delay line 4 to detect the distortion component generated in the (remaining part) of the amplified signal in the main amplifier 3, and outputs the result to the vector adjuster 7.

The distortion occurring in the main amplifier 3 when the input multifrequency signal is amplified is, for example, intermodulation distortion.

Preferably, the distortion detection loop detects and outputs to the vector adjuster 7 only the distortion component produced in the main amplifier 3. Insofar as effective distortion compensation can be practically realized, however, the distortion component detected by the distortion detection loop can include other components such as the input multifrequency signal.

The amplified signal sent from the main amplifier to the directional combiner 5 contains the multifrequency signal component amplified by the main amplifier 3 and the distortion component generated in the main amplifier 3. On the other hand, the multifrequency signal sent from the delay line 4 to the directional combiner 5 does not contain the distortion component. By appropriately setting the amount of signal amplitude and phase adjustment by the vector adjuster 2 and the amount of signal delay by the delay line 4, therefore, the distortion component can be detected in the directional combiner 5 by subjecting the two input signals to reverse-phase addition with respect to the input multifrequency signals. In the reverse-phase addition, the two signals are, for example, added (synthesized) at the same delay, same amplitude and opposite phase (phase difference of 180 degrees).

The delay line 6, vector adjuster 7, auxiliary amplifier 8 and directional combiner 9 constitute a distortion removal loop downstream of the directional combiner 5.

In the distortion removal loop, the amplified signal output from the directional combiner 5 is delayed by the delay line 6 and input to the directional combiner 9. The distortion component detected by the directional combiner 5 is adjusted in amplitude and phase by the vector adjuster 7, amplified to a desired power by the auxiliary amplifier 8, and input to the directional combiner 9. The directional combiner 9 removes the distortion component from the amplified signal by adding the delayed amplified signal received from the delay line 6 and the distortion component received from the auxiliary amplifier 8 and outputs the result from the output terminal D.

The amplified signal sent from the delay line 6 to the directional combiner 9 contains the multifrequency signal component amplified by the main amplifier 3 and the distortion component generated in the main amplifier 3. On the other hand, the singal sent from the auxiliary amplifier 8 to the directional combiner 9 contains the distortion component. By appropriately setting the amount of amplitude and phase adjustment of the distortion component by the vector adjuster 7 and the signal delay by the delay line 6, therefore, the distortion component can be removed from the amplified signal in the directional combiner 9 by subjecting the two input signals to reverse-phase addition with respect to the distortion component.

The pilot signal generator 10 generates and outputs a prescribed signal as a pilot signal. The pilot signal is synthesized with the input multifrequency signal transmitted from the vector adjuster 2 to the main amplifier 3. The receiver 11 receives part of the signal output by the directional combiner 9 and detects the pilot signal contained in the received part of the signal. The vector adjuster 7 is controlled to diminish the pilot signal detected by the receiver 11. The distortion removal loop is thus optimized by using the pilot signal. The control circuit 12 controls the vector adjuster 2 based on the result of pilot signal detection by the receiver 11. The two vector adjusters 2 and 7 are provided to set optimum adjustment values in the respective loops.

The common amplifier unit shown in FIG. 5 deals not only with the input multifrequency signal and the distortion component it causes to be generated in the main amplifier 3 but also with the pilot signal and the distortion component it causes to be generated in the main amplifier 3. In the interest of simplicity, however, the ensuing explanation and the associated drawings will touch on only the input multifrequency signal and the distortion component generated as a result thereof and no explanation or elements in the drawings will be presented regarding the pilot signal and the distortion component generated as a result thereof.

FIG. 6 is a graph showing an example of the amplified signal output by the main amplifier 3 when a two-component signal composed of signal component of a frequency of f0 [MHz] and a signal component of a frequency f1 [MHz] is input to the input terminal C of the common amplifier unit. The horizontal axis of the graph represents frequency [MHz] and the vertical axis represents signal level. It can be seen from this graph that when the main amplifier 3 amplifies the input multifrequency signal composed of the signal components of frequencies f0 and f1, intermodulation distortion occurs that consists of low-frequency side distortion at a frequency of {f0−(f1−f0)} [MHz] and high-frequency distortion at a frequency of {f1+(f1−f0)} [MHz]. The interval between two frequencies at which these distortions occur increases in proportion as the bandwidth of the signal input through the input terminal C increases.

FIG. 7 is a graph showing an example of the amount of distortion suppression required by the amplified signal after distortion removal output from the output terminal D of the common amplifier unit. The horizontal axis of the graph represents frequency [MHz] and the vertical axis represents signal level.

FIG. 8 is a graph showing an example of the distortion suppression characteristic Q2 of the distortion removal loop required with respect to an input multifrequency signal composed of f0 and f1 frequency components. The horizontal axis of the graph represents frequency [MHz] and the vertical axis represents distortion suppression [dB].

In distortion compensation using the feedforward method, the practice is, for instance, to extract the distortion component in the distortion detection loop and finally remove the distortion by synthesizing the amplified distortion component and the distortion component contained in the signal amplified by the main amplifier 3 at the same delay, same amplitude and opposite phase. The distortion suppression characteristic of the distortion removal loop therefore requires distortion suppression in a 3×(f1−f0) [MHz] band.

In this case, assuming that, as shown in FIG. 6, the level of the distortion generated in the main amplifier 3 is X [dB] smaller than the level of the amplified input multifrequency signal and that, as shown in FIG. 7, the level of the distortion required at the output terminal D of the common amplifier unit is Y [dB] smaller than the level of the amplified input multifrequency signal, it follows that the amount of distortion suppression of the distortion removal loop required at the distortion frequencies {f0−(f1−f0)} and {f1+(f1−f0)} is Y−X=Z [dB], where Y>X.

FIG. 9(a) is a graph showing an example of how the amount of distortion suppression of the distortion removal loop realized differs among different sets of amplitude deviation d value [dB] and phase deviation θ value [deg] when component between the delay and AMP paths. The horizontal axis of the graph represents amplitude deviation d value [dB] and the vertical axis represents phase deviation θ value [deg]. As termed here, "delay line path" refers to the signal path equipped with the delay line 6 and "AMP path" to the signal line path equipped with the vector adjuster 7 and the auxiliary amplifier 8.

As a simplified model of the distortion removal loop, FIG. 9(b) shows a circuit composed of a distributor 31 for dividing the input signal into signals of the same voltage V0, a vector adjuster 32 for adjusting the amplitude and phase of one divided signal, and a directional combiner 33 for adding the adjusted one divided signal and another divided signal.

In the example shown in FIG. 9(a), when the amplitude deviation d value is within ±0.1 [dB] and the phase deviation θ value is within ±1.0 [deg], the distortion suppression of the distortion removal loop is 35 [dB]. As shown by the broken lines in FIG. 7, this distortion suppression corresponds to the level that the distortion component generated in the main amplifier 3 should be suppressed and, as shown in FIG. 8, corresponds to the distortion suppression required at the distortion component frequencies of {f0−(f1−f0)} and {f1+(f1−f0)}.

When a conventional distortion compensation amplifier like the one shown in FIG. 5 is input with a signal composed of two frequency components whose frequencies are at opposite ends of the band used, a broadband property enabling sufficiently accurate distortion removal in a frequency band three times that of the used band is required. However, the technology of the prior art can achieve only a limited broadband property. This disadvantage has made it difficult to realize a broadband feedforward type amplifier unit.

The present invention was accomplished to overcome this drawback of the prior art and has as an object to provide a distortion compensation amplifier that by reducing the distortion suppression required in the distortion removal loop enables amplification with distortion compensation of signals of broader band than heretofore

SUMMARY OF THE INVENTION

The present invention achieves these objects by providing a distortion compensation amplifier comprising a distortion detection loop and a distortion removal loop. The distortion detection loop divides the signal (the signal to be amplified) into two signals, amplifies one divided signal with an amplifier and uses the amplified signal and another divided signal to detect a distortion component generated and introduced into the amplified signal in the amplifier. The distortion removal loop effects distortion compensation by removing the detected distortion component from the amplified signal produced by the amplifier.

More specifically, the distortion detection loop includes filter means for reducing the distortion component of the amplified signal output by the amplifier that was generated and introduced into the amplified signal in the amplifier and detects the distortion component reduced by the filter means. The distortion removal loop removes the detected distortion component from the amplified signal that was produced by the amplifier and whose distortion component was reduced by the filter means.

Owing to the reduction of the distortion component detected by the distortion detection loop, the distortion component to be dealt with by the distortion removal loop is reduced. The amount of distortion suppression required in the distortion removal loop is therefore less than heretofore. This enables amplification with distortion compensation of signals over a broader band than heretofore. Specifically, it becomes possible, for example, to realize a broadband feedforward type amplifier unit, which has not been readily possible to implement using conventional technologies. The distortion removal loop deals with the distortion component detected by the distortion detection loop and the distortion component contained in the amplified signal input from the distortion detection loop.

The signal to be amplified can be any of various types but the present invention is particularly suitable for amplification of broadband signals.

The amplifier can be any of various types and can be a single amplifier or multiple amplifiers. Use of a common amplifier is particularly suitable in the present invention.

The filter means can be any of various types, such as a band-pass filter, low-pass filter or high-pass filter. Two or more filters may be used in combination. When the signal to be amplified includes two frequency components and compensation is carried out with respect to paired distortions occurring at frequencies symmetrically located on the low-frequency and high-frequency sides, a preferable embodiment can be configured by using a band-pass filter that reduces (attenuates) both distortions of the pair by the same amount of reduction (attenuation).

The degree to which the filter means reduces the distortion component of the amplified signal output by the amplifier that was generated and introduced into the amplified signal in the amplifier (the degree to which the distortion removal loop reduces the distortion) can be any of various degrees.

DESCRIPTION OF THE PREFERRED EMBODIMENT

Figure 1:
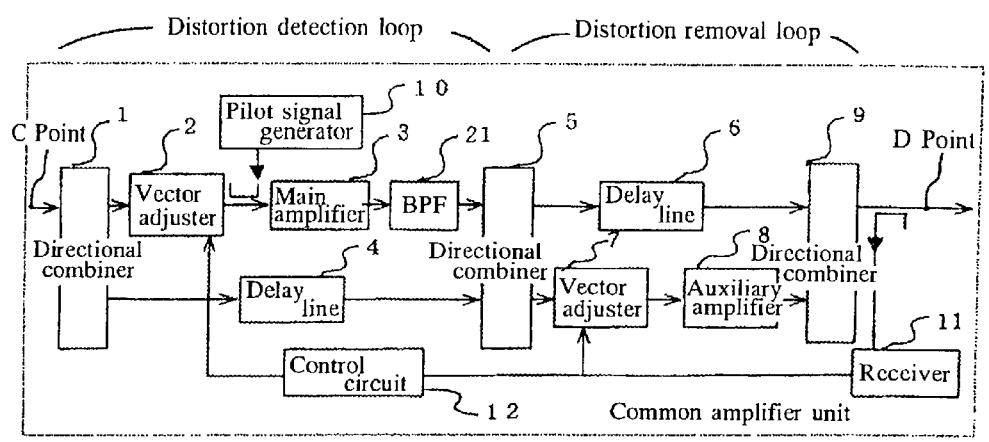
FIG. 1 is a block diagram showing a common amplifier unit that is an embodiment of the present invention.

An embodiment of the present invention will now be explained with reference to the drawings FIG. 1 is a block diagram showing a distortion compensation amplifier that is an embodiment of the present invention. The illustrated distortion compensation amplifier is configured as a common amplifier unit capable of distortion compensation by the feedforward method. (A common amplifier uses an amplifier to amplify signals including multiple frequency components.)

Figure 5:
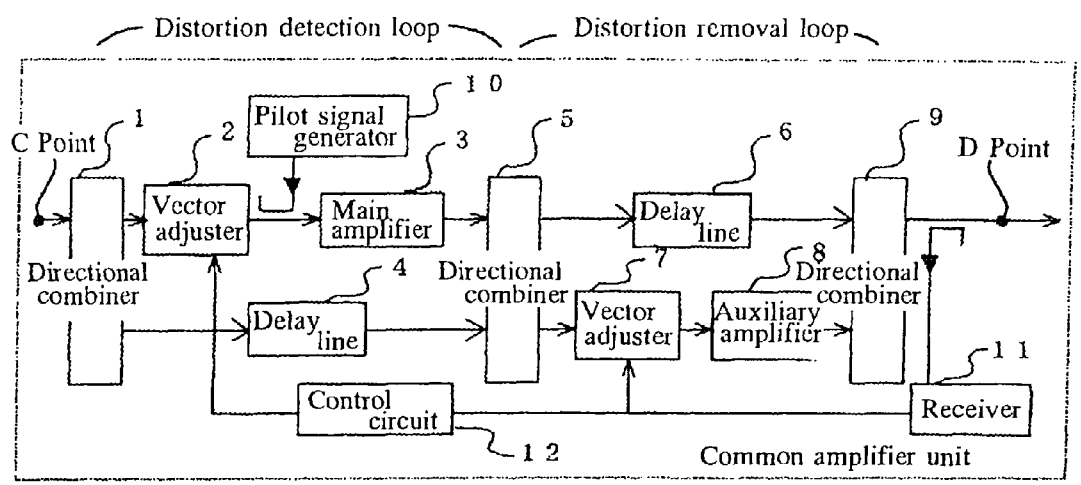
FIG. 5 is a block diagram exemplifying a common amplifier unit of the prior art.

As shown in FIG. 1, the common amplifier unit of this embodiment comprises constituents identical with those of the common amplifier unit shown in FIG. 5, namely, three directional combiners 1, 5 and 9, two vector adjusters 2 and 7, a main amplifier 3, two delay lines 4 and 6, an auxiliary amplifier 8, a pilot signal generator 10, a receiver 11 and a control circuit 12. The common amplifier unit of this embodiment is further equipped with a band-pass filter (BPF) 21 provided between the main amplifier 3 and the directional combiner 5. The band-pass filter 21 is a characterizing constituent of the present invention provided. Also shown are an input terminal C and an output terminal D of the common amplifier unit.

For simplicity of explanation, the constituent elements 1–12, C and D of this embodiment, which are the same as constituent elements of the common amplifier unit shown in FIG. 5, are assigned the same reference symbols as their counterparts in FIG. 5 and will not be explained in detail again in the following.

The common amplifier in this embodiment deals not only with the input multifrequency signal and the distortion component it causes to be generated in the main amplifier 3 but also with the pilot signal and the distortion component it causes to be generated in the main amplifier 3. In the interest of simplicity, however, the ensuing explanation and the drawings will touch on only the input multifrequency signal and the distortion component generated as a result thereof and no explanation or elements in the drawings will be presented regarding the pilot signal and the distortion component generated as a result thereof.

In the present embodiment, the main amplifier 3 amplifies the input multifrequency signal output by the vector adjuster 2 and the pilot signal output by the pilot signal generator 10 and forwards the amplified signals to the band-pass filter 21.

The band-pass filter 21 reduces the distortion component contained in the amplified signal received from the main amplifier 3 that was generated and introduced into the amplified signal in the main amplifier 3 owing to the input multifrequency signal and outputs the amplified signal after distortion component reduction to the directional combiner 5.

In the present embodiment, the directional combiner 5 uses the distortion-component-reduced amplified signal received from the band-pass filter 21 and the delayed input multifrequency signal received from the delay line 4 to detect the distortion component and outputs the result to the vector adjuster 7. It also outputs the distortion-component-reduced amplified signal to the delay line 6.

Figure 2:
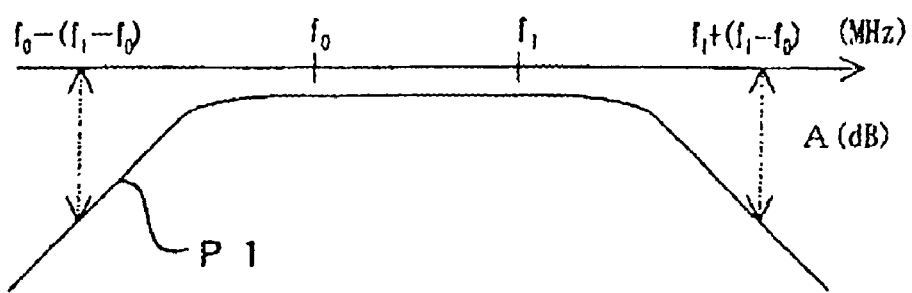
FIG. 2 is a graph exemplifying the attenuation characteristic of a band-pass filter.
Figure 6:
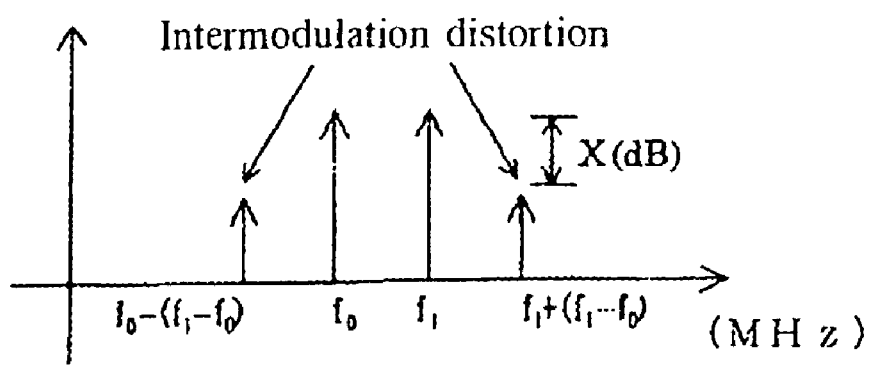
FIG. 6 is a graph exemplifying the output of a main amplifier.
Figure 7:
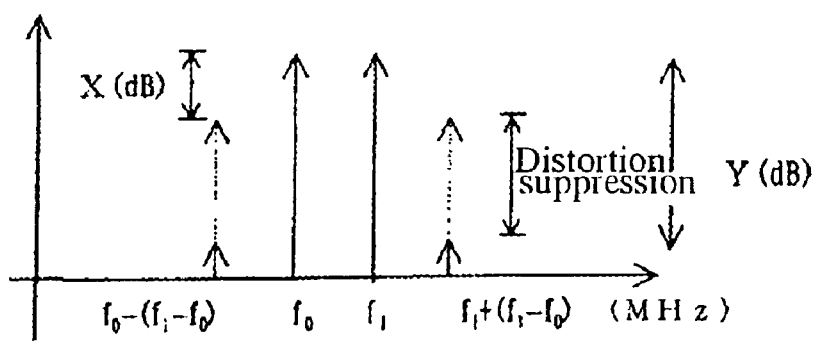
FIG. 7 is a graph exemplifying the amount of distortion suppression required in the output of a common amplifier unit.

The graph of FIG. 2 exemplifies the attenuation characteristic P1 of the band-pass filter 21 of this embodiment. The horizontal axis of the graph represents frequency [MHz] and the vertical axis represents amount of attenuation [dB]. In this embodiment, a two-frequency component signal composed of a signal component of frequency f0 and a signal component of a frequency of f1 is input to the input terminal C as the signal to be amplified. Further, in this embodiment, the pass band of the band-pass filter 21 coincides with the use band of the main amplifier 3 and is, for example, a band extending from frequency f0 [MHz] to the frequency f1 [MHz]. The amount of attenuation of the band-pass filter 21 at the frequencies {f0−(f1−f0)} and, {f1+(f1−f0)} at which distortion is generated in the main amplifier 3 is defined as A [dB]. In this embodiment, the level of the distortion generated in the main amplifier 3 is, for example, the same as that shown in FIG. 6. The amount of distortion suppression required in the distortion removal loop is, for example, the same as that shown in FIGS. 7 and 8.

Figure 3:
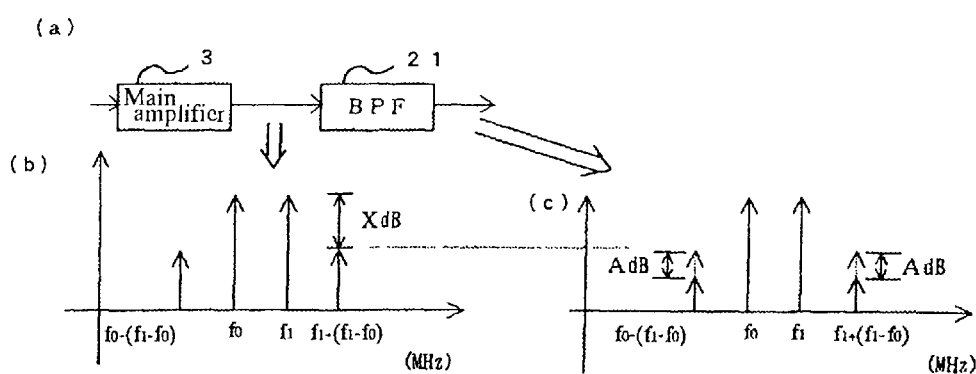
FIG. 3 is a diagram exemplifying distortion attenuation by a band-pass filter.

FIG. 3(a) shows the part of the configuration associated with the main amplifier 3 and the band-pass filter 21. FIG. 3(b) exemplifies the amplified signal output by the main amplifier 3 and FIG. 3(c) exemplifies the distortion-component-reduced amplified signal output by the band-pass filter 21. In the graphs of FIG. 3(b) and 3(c), the horizontal axes represent frequency [MHz] and the vertical axes represent signal level.

As shown in FIGS. 3(b) and 3(c), the distortion component generated in the main amplifier 3 is reduced by the amount of the distortion component signal A [dB] owing to the reduction by the attenuation characteristic P1 of the band-pass filter 21.

In a conventional configuration not equipped with the band-pass filter 21, the distortion removal loop would require a distortion suppression amount of Y−X=Z [dB], because in such a configuration the level of the distortion generated in the main amplifier 3 is X [dB] smaller than the level of the input multifrequency signal and the amount of distortion suppression required in the output from the output terminal D of the common amplifier unit (the final output) is Y [dB]. In the distortion removal loop of this embodiment, on the other hand, the amount of distortion suppression is Y−X−A=Z' [dB], so that the amount of distortion suppression required is diminished by A [dB].

Figure 4:
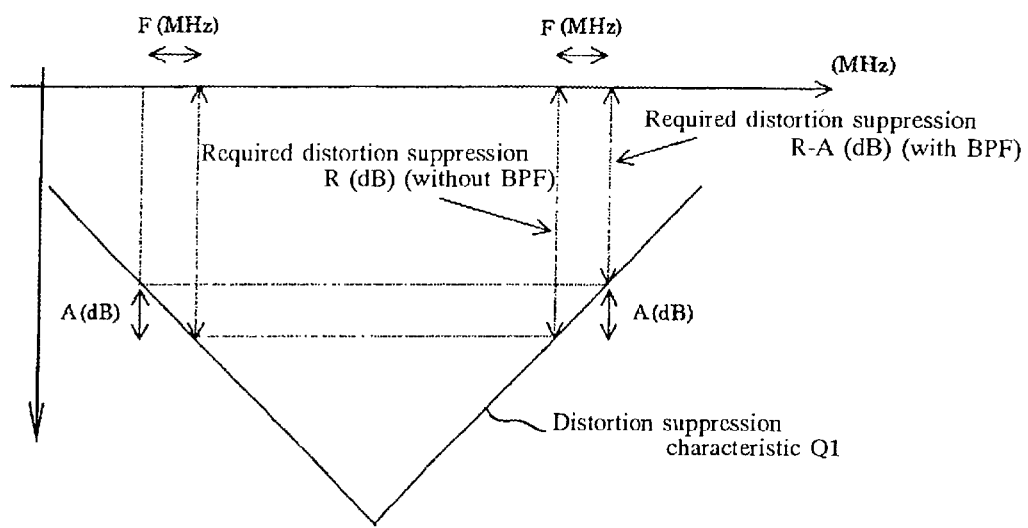
FIG. 4 is a graph exemplifying a band over which the suppression characteristic of a distortion removal loop enables amplification with distortion compensation.

FIG. 4 is a graph exemplifying a distortion suppression characteristic Q1 of the distortion removal loop. The horizontal axis of the graph represents frequency [MHz] and the vertical axis represents distortion suppression. As shown in this figure, where the amount of distortion suppression required by the distortion removal loop when the band-pass filter 21 is not provided is defined as R [dB], the amount of distortion suppression required by the distortion removal loop when the band-pass filter 21 is provided becomes R−A=R' [dB]. As a result, the band over which signals are amplifiable by the main amplifier 3 while conducting distortion compensation is broadened by the amount of (F×2) [MHz] shown in FIG. 4 as compared with the case where the band-pass filter 21 is not incorporated.

Figure 8:
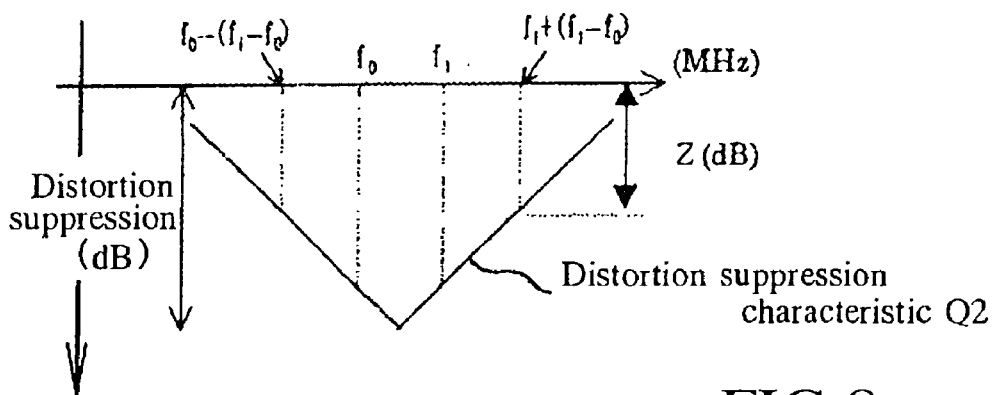
FIG. 8 is a graph exemplifying the amount of distortion suppression required in the distortion suppression characteristic of a distortion removal loop.
Figure 9:
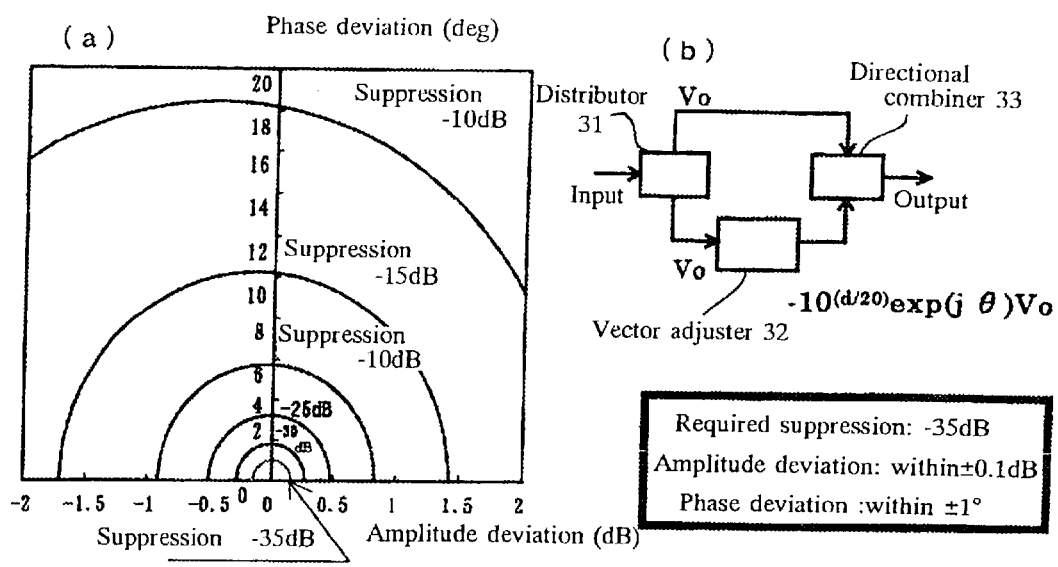
FIG. 9 is diagram for explaining the amount of distortion suppression of a distortion removal loop.

By way of a specific example, should the distortion suppression characteristic Q1 shown in FIG. 4 be made the same as the distortion suppression characteristic Q2 shown in FIG. 8 discussed earlier, the aforesaid R would become equal to Z (R=Z) and the aforesaid R' would become equal to Z' (R'=Z'). In this embodiment, when distortion suppression characteristic of the distortion removal loop is made the same as the conventional characteristic in this manner, the signal band over which the common amplitier unit can conduct amplification with distortion compensation is broadened by (2×F) [Mhz].

Moreover, since the foregoing configuration of the present embodiment enables the amount of distortion suppression required by the distortion removal loop to be made smaller than conventionally, it is also possible, as another example, to achieve greater tolerance to the amount of distortion suppression than heretofore.

In an actual circuit, the attenuation of the band-pass filter 21 used is based on such factors as the band used, the amount of distortion generated in the main amplifier 3, and the distortion suppression characteristic Q1 of the distortion removal loop.

The foregoing embodiment was explained with reference to the case where the common amplifier unit is input with a two-frequency signal for amplification. The same effects can, however, also be realized when the signal input to the common amplifier unit for amplification is a signal including three or more frequency components (a multicarrier signal).

When a common amplifier unit is installed in the transmitter unit of the base station of a mobile telecommunications system, a filter for removing second, third and higher harmonics is ordinarily inserted at the terminal of the base station for outputting the amplified transmission signal to the antenna (at the antenna output terminal). The configuration of the present embodiment including the band-pass filter 21 also enables a reduction in the amount of attenuation required by the filter for harmonic removal.

As explained above, the common amplifier unit according to the foregoing embodiment includes a distortion detection loop wherein solely the distortion component produced when the main amplifier 3 amplifies an input signal to a prescribed power is detected by synthesizing the signal without distortion (the main signal) and the signal amplified by the main amplifier 3 at the same delay, the same amplitude and opposite phase with respect to the input signal to remove only the input signal component form the amplified signal, and a distortion removal loop wherein the detected distortion component is removed from the amplified signal by synthesizing a signal amplified to a prescribed power by the auxiliary amplifier 8 and the amplified signal containing the distortion component at the same delay, the same amplitude and opposite phase with respect to the distortion component. When these two loops are used to conduct amplification with feedforward distortion compensation so as to acquire a distortion-free input signal amplified to a prescribed power, the provision of the band-pass filter 21 at the output terminal of the main amplifier 3 attenuates the distortion component generated in the main amplifier 3 to diminish the amount of distortion suppression required in the distortion removal loop and thus enable it to have a broader band characteristic, thereby making it possible to provide a broadband common amplifier unit.

Thus, when carrier signals of frequencies located at the opposite ends of the band used by the main amplifier 3 are input and cause occurrence of distortion extending over a broad frequency range in the main amplifier 3, the common amplifier unit according to the foregoing embodiment can reduce the distortion component produced in the main amplifier 3 by the attenuation characteristic P1 of the band-pass filter 21 provided on the output side of the main amplifier 3. The amount of distortion suppression of the distortion removal loop can therefore be made suitable over a broad band of frequencies. In addition, it becomes possible to realize a broadband feedforward type amplifier unit, which has been difficult to accomplish using existing technologies.

In the foregoing embodiment, the amplifier defined as a constituent of the present invention is constituted by the main amplifier 3.

In the foregoing embodiment, the circuit of the distortion detection loop circuit defined as a constituent of the present invention is constituted by a circuit wherein a signal input through the input terminal C is divided by the directional combiner 1, one divided signal is passed through the vector adjuster 2 and amplified by the main amplifier 3, and the directional combiner 5 uses the result obtained by filtering the amplified signal with the band-pass filter 21 and another divided signal after it is passed through the delay line 4 to detect the distortion component produced in the main amplifier 3 and contained in the result of the filtering.

In the foregoing embodiment, the circuit of the distortion removal loop defined as a constituent of the present invention is constituted as a circuit wherein the distortion component detected by the distortion detection loop is processed by the vector adjuster 7 and the auxiliary amplifier 8, the signal amplified by the main amplifier 3 is passed through the delay line 6, and the directional combiner 9 removes the distortion component from the amplified signal.

In the foregoing embodiment, the filter means defined as a constituent of the present invention is constituted as the function of the band-pass filter 21 that reduces the distortion component contained in the amplified signal output by the main amplifier 3 that was generated in the main amplifier 3.

In the foregoing embodiment, the distortion detection loop is equipped with the filter means 21 and the distortion component reduced by the filter means 21 is is detected. Moreover, in the foregoing embodiment, the distortion removal loop removes the distortion component detected by the distortion detection loop from the amplified signal that was output by the main amplifier 3 and whose distortion component was reduced by the filter means 21.

The configuration of the distortion compensation amplifier according to this invention is not limited to that set out in the foregoing and any of various other configurations can be adopted instead.

In addition, the field of application of the invention is not limited to that discussed in the foregoing and application in various other fields is also possible.

In addition, the various types of processing performed in the distortion compensation amplifier according to this invention may be constituted by being implemented in hardware resources equipped with a processor and memory and the like, for example, being controlled by means of a processor executing a control program stored in ROM (Read Only Memory). Further, the various functional means for executing this processing may also be constituted as independent physical circuits.

In addition, the present invention may also be understood as the aforesaid program itself or as a Floppy Disk®, CD (compact disk)-ROM or other computer-readable recording media in which the program is stored, so that the processing according to the present invention can be implemented by loading said control program from the recording medium into a computer and executing the program by a processor.

As explained in the foregoing, in the distortion compensation amplifier according to the present invention, the distortion detection loop divides a signal, amplifies one divided signal with the amplifier and uses the amplified signal and another divided signal to detect a distortion component generated and introduced into the amplified signal in the amplifier, and the distortion removal loop removes from the amplified signal the detected distortion component that was produced by the amplifier. In this process, the distortion detection loop uses the filter means to reduce the distortion component of the amplified signal output by the amplifier that was generated and introduced into the amplified signal in the amplifier and detects the distortion component reduced by the filter means. The distortion removal loop removes the detected distortion component from the amplified signal that was produced by the amplifier and whose distortion component was reduced by the filter means. The amount of distortion suppression required in the distortion removal loop is therefore less than heretofore. This enables amplification with distortion compensation of signals of broader band than heretofore.

What is claimed is:

1. A distortion compensation amplifier comprising:
    a distortion detection loop comprising an amplifier, said distortion detection loop being operable to divide an input signal, said amplifier being operable to amplify one divided signal, said distortion detection loop being further operable to use the amplified signal and another divided signal to detect a distortion component generated and introduced into the amplified signal by said amplifier; and
    a distortion removal loop operable to remove the detected distortion component from the amplified signal,
    wherein said distortion detection loop further comprises a filter operable to reduce the distortion component and to detect the reduced distortion component, and
    wherein said distortion removal loop is operable to remove the detected reduced distortion component from the amplified signal.

2. A distortion compensation amplifier according to claim 1, wherein said distortion detection loop further comprises a first directional combiner operable to divide the input signal, a first vector adjuster operable to adjust the amplitude and phase of one divided signal, a main amplifier operable to amplify the adjusted one divided signal, a first delay line operable to delay the other divided signal and a second directional combiner operable to detect the distortion component via the amplified signal whose distortion component was reduced and the other delayed divided signal, and
    wherein said distortion removal loop comprises a second delay line for delaying the amplified signal whose distortion component was reduced, a second vector adjuster for adjusting the amplitude and phase of the distortion component detected by said second directional combiner, an auxiliary amplifier for amplifying the adjusted distortion component and a third directional combiner for removing the amplified adjusted distortion component from the delayed amplified signal.

3. A distortion compensation amplifier according to claim 2, wherein said filter comprises a band-pass filter.

4. A distortion compensation amplifier according to claim 3, further comprising:
    a pilot signal generator operable to produce a prescribed signal as a pilot signal, said main amplifier being operable to synthesize the pilot signal with the signal transmitted from said first vector adjuster; and
    a receiver operable to receive part of the signal output by said third directional combiner and to detect the pilot signal contained in the part of the signal,
    wherein said first vector adjuster and said second vector adjuster are controlled based on the detected pilot signal.

5. A distortion compensation amplifier according to claim 4, wherein said distortion detection loop and said distortion removal loop are operable to process a signal including multiple frequency components.

6. A distortion compensation amplifier according to claim 3, wherein said distortion detection loop and said distortion removal loop are operable to process a signal including multiple frequency components.

7. A distortion compensation amplifier according to claim 2, further comprising:
    a pilot signal generator operable to produce a prescribed signal as a pilot signal, said main amplifier being operable to synthesize the pilot signal with the signal transmitted from said first vector adjuster; and
    a receiver operable to receive part of the signal output by said third directional combiner and to detect the pilot signal contained in the part of the signal,
    wherein said first vector adjuster and said second vector adjuster are controlled based on the detected pilot signal.

8. A distortion compensation amplifier according to claim 7, wherein said distortion detection loop and said distortion removal loop are operable to process a signal including multiple frequency components.

9. A distortion compensation amplifier according to claim 2, wherein said distortion detection loop and said distortion removal loop are operable to process a signal including multiple frequency components.

10. A distortion compensation amplifier according to claim 1, wherein said filter comprises a band-pass filter.

11. A distortion compensation amplifier according to claim 10, wherein said distortion detection loop and said distortion removal loop are operable to process a signal including multiple frequency components.

12. A distortion compensation amplifier according to claim 1, wherein said distortion detection loop and said distortion removal loop are operable to process a signal including multiple frequency components.

13. A base station used in a mobile telecommunications system comprising:

a transmitter unit that includes a distortion compensation amplifier operable to amplify signals to be wirelessly transmitted, wherein said a distortion compensation amplifier comprises a distortion detection loop and a distortion removal loop, wherein said distortion detection loop comprises an amplifier, said distortion detection loop being operable to divide an input signal, said amplifier being operable to amplify one divided signal, said distortion detection loop being further operable to use the amplified signal and another divided signal to detect a distortion component generated and introduced into the amplified signal by said amplifier, wherein said distortion removal loop is operable to remove the detected distortion component from the amplified signal, wherein said distortion detection loop further comprises a filter operable to reduce the distortion component and to detect the reduced distortion component, and wherein said distortion removal loop is operable to remove the detected reduced distortion component from the amplified signal.

14. A base station according to claim 13, wherein said distortion detection loop further comprises a first directional combiner operable to divide the input signal, a first vector adjuster operable to adjust the amplitude and phase of one divided signal, a main amplifier operable to amplify the adjusted one divided signal, a first delay line operable to delay the other divided signal and a second directional combiner operable to detect the distortion component via the amplified signal whose distortion component was reduced and the other delayed divided signal, and wherein said distortion removal loop comprises a second delay line for delaying the amplified signal whose distortion component was reduced, a second vector adjuster for adjusting the amplitude and phase of the distortion component detected by said second directional combiner, an auxiliary amplifier for amplifying the adjusted distortion component and a third directional combiner for removing the amplified adjusted distortion component from the delayed amplified signal.

15. A base station according to claim 14, wherein said filter comprises a band-pass filter.

16. A base station according to claim 15, wherein the distortion compensation amplifier further comprises:

a pilot signal generator operable to produce a prescribed signal as a pilot signal, said main amplifier being operable to synthesize the pilot signal with the signal transmitted from said first vector adjuster; and a receiver operable to receive part of the signal output by said third directional combiner and to detect the pilot signal contained in the part of the signal, wherein said first vector adjuster and said second vector adjuster are controlled based on the detected pilot signal.

17. A base station according to claim 15, wherein said distortion detection loop and said distortion removal loop are operable to process a signal including multiple frequency components.

18. A base station according to claim 14, wherein the distortion compensation amplifier further comprises:

a pilot signal generator operable to produce a prescribed signal as a pilot signal, said main amplifier being operable to synthesize the pilot signal with the signal transmitted from said first vector adjuster; and a receiver operable to receive part of the signal output by said third directional combiner and to detect the pilot signal contained in the part of the signal, wherein said first vector adjuster and said second vector adjuster are controlled based on the detected pilot signal.

19. A base station according to claim 13, wherein said filter comprises a band-pass filter.

20. A base station according to claim 13, wherein said distortion detection loop and said distortion removal loop are operable to process a signal including multiple frequency components.

* * * * *